(12) United States Patent
Hayk et al.

(10) Patent No.: US 10,426,046 B2
(45) Date of Patent: Sep. 24, 2019

(54) ROLLABLE DISPLAY DEVICE

(71) Applicant: SAMSUNG DISPLAY CO., LTD., Yongin-si, Gyeonggi-do (KR)

(72) Inventors: Khachatryan Hayk, Hwaseong-si (KR); Ki Hyun Kim, Daegu (KR); Sun Ho Kim, Seongnam-si (KR); Jeong Ho Kim, Seoul (KR); Tae Woong Kim, Seongnam-si (KR); Jung Hun Lee, Hwaseong-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/611,058

(22) Filed: Jun. 1, 2017

(65) Prior Publication Data

US 2017/0359911 A1 Dec. 14, 2017

(30) Foreign Application Priority Data

Jun. 9, 2016 (KR) .................. 10-2016-0071808

(51) Int. Cl.
| | |
|---|---|
| *H05K 5/00* | (2006.01) |
| *H05K 5/02* | (2006.01) |
| *H05K 5/03* | (2006.01) |
| *G09F 9/30* | (2006.01) |
| *G06F 1/16* | (2006.01) |

(52) U.S. Cl.
CPC .......... *H05K 5/0017* (2013.01); *G09F 9/301* (2013.01); *H05K 5/0217* (2013.01); *H05K 5/0221* (2013.01); *H05K 5/03* (2013.01); *G06F 1/1652* (2013.01)

(58) Field of Classification Search
CPC ... G06F 1/1652; G06F 1/1601; H05K 5/0017; H05K 5/0221; H05K 5/03; H05K 5/0217
See application file for complete search history.

(56) References Cited

U.S. PATENT DOCUMENTS

| | | | | |
|---|---|---|---|---|
| 7,463,238 | B2 * | 12/2008 | Funkhouser | .......... G06F 1/1601 345/107 |
| 8,009,422 | B2 * | 8/2011 | Misawa | ............ G02F 1/133305 345/156 |
| 8,385,055 | B2 | 2/2013 | Kao et al. | |
| 8,576,555 | B2 | 11/2013 | Misawa | |
| 9,098,241 | B1 | 8/2015 | Cho et al. | |
| 2006/0107566 | A1* | 5/2006 | Van Rens | ................. G09F 9/35 40/515 |
| 2007/0241002 | A1* | 10/2007 | Wu | ....................... G06F 1/1601 206/150 |
| 2009/0302176 | A1* | 12/2009 | Kuroi | ..................... F16M 11/38 248/176.3 |

(Continued)

FOREIGN PATENT DOCUMENTS

| | | |
|---|---|---|
| EP | 2546720 A2 | 1/2013 |
| KR | 10-2005-0085090 | 8/2005 |

(Continued)

*Primary Examiner* — Steven T Sawyer
*Assistant Examiner* — Sagar Shrestha
(74) *Attorney, Agent, or Firm* — Lee & Morse, P.C.

(57) ABSTRACT

A rollable display device includes a roller, a rollable display that is rollable onto the roller in a first direction, and a plurality of thin plates positioned at a rear surface of the rollable display, the thin plates being rollable onto the roller in the first direction along with the rollable display.

14 Claims, 7 Drawing Sheets

(56) References Cited

U.S. PATENT DOCUMENTS

| | | | | |
|---|---|---|---|---|
| 2011/0043976 | A1* | 2/2011 | Visser | G09F 9/00 |
| | | | | 361/679.01 |
| 2012/0314399 | A1 | 12/2012 | Bohn et al. | |
| 2013/0180882 | A1 | 7/2013 | Hamers et al. | |
| 2014/0247544 | A1* | 9/2014 | Ryu | G09F 11/18 |
| | | | | 361/679.01 |
| 2016/0014919 | A1* | 1/2016 | Huitema | G06F 1/1652 |
| | | | | 313/511 |
| 2016/0170450 | A1* | 6/2016 | Kim | G06F 1/1652 |
| | | | | 361/807 |
| 2016/0187929 | A1* | 6/2016 | Kim | G06F 1/1652 |
| | | | | 345/184 |
| 2016/0205791 | A1* | 7/2016 | Kim | G06F 1/1652 |
| | | | | 361/679.01 |
| 2016/0231843 | A1* | 8/2016 | Kim | G06F 3/0412 |
| 2016/0363960 | A1* | 12/2016 | Park | G06F 1/1656 |
| 2016/0374228 | A1* | 12/2016 | Park | G09F 9/301 |
| 2017/0329369 | A1* | 11/2017 | Takayanagi | G06F 1/1652 |

FOREIGN PATENT DOCUMENTS

| | | |
|---|---|---|
| KR | 10-0818170 | 3/2008 |
| WO | WO 2006/038171 A1 | 4/2006 |
| WO | WO 2006/085271 A2 | 8/2006 |
| WO | WO 2008/054206 A2 | 5/2008 |

* cited by examiner

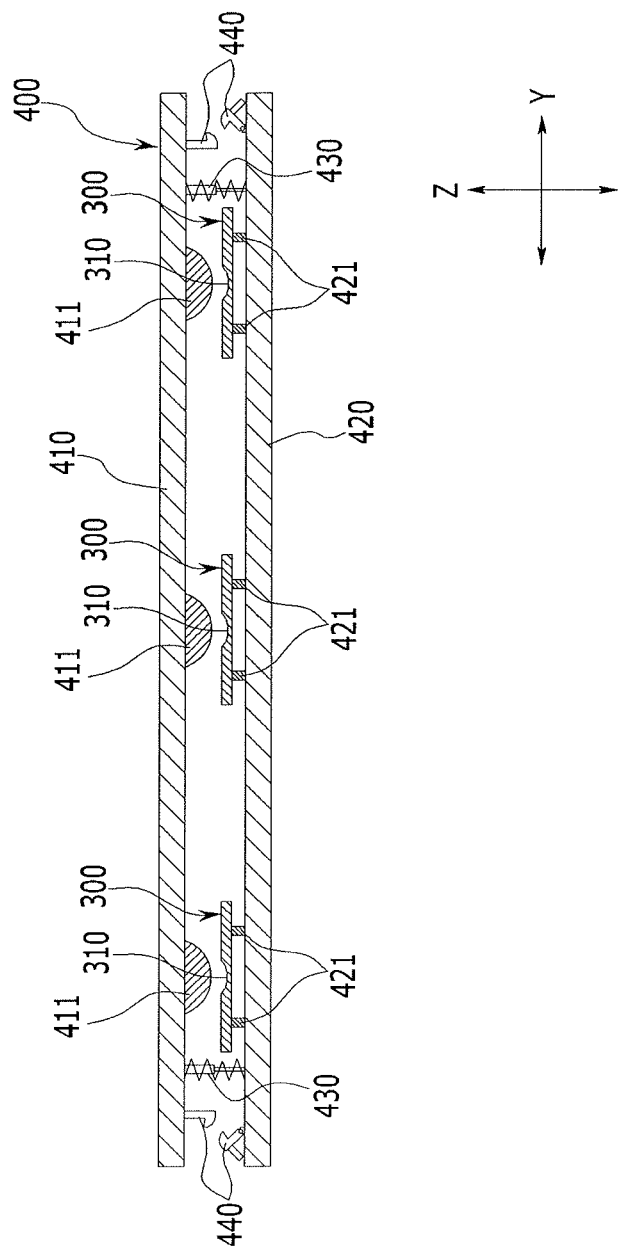

ROLLABLE DISPLAY DEVICE

CROSS-REFERENCE TO RELATED APPLICATION

Korean Patent Application No. 10-2016-0071808, filed on Jun. 9, 2016, in the Korean Intellectual Property Office, and entitled: "Rollable Display Device," is incorporated by reference herein in its entirety.

BACKGROUND

1. Field

Embodiments relate to a rollable display device.

2. Description of the Related Art

A display device is a device that displays an image. A rollable display device is a display device including a flexible display that is rollable onto a roller and unrollable from the roller. The rollable display may be rolled onto the roller to reduce a size of the rollable display device, thereby increasing portability.

SUMMARY

Embodiments are directed to a rollable display device, including a roller, a rollable display that is rollable onto the roller in a first direction, and a plurality of thin plates positioned at a rear surface of the rollable display, the thin plates being rollable onto the roller in the first direction along with the rollable display.

The plurality of thin plates may be spaced apart from each other in a second direction crossing the first direction.

The rollable display and the plurality of thin plates may be unrollable from the roller in the first direction. The plurality of thin plates in a state of being unrolled from the roller may be bent with a curvature in the second direction at the rear surface of the rollable display.

In the state of the rollable display and the plurality of thin plates being unrolled from the roller, edges of the plurality of thin plates in the second direction may support the rear surface of the rollable display.

In the state of the rollable display and the plurality of thin plates being unrolled from the roller, the curvature of the plurality of thin plates in the second direction may increase relative to a distance from the roller in the first direction.

The plurality of thin plates include a groove that is recessed and extends in the first direction. The groove may face the rollable display.

The plurality of thin plates in a state of being rolled onto the roller may be flat in the second direction.

The roller may include a fixing shaft extending in the second direction, a rotation roll extending in the second direction, the rotation roll being rotatable with respect to the fixing shaft to roll and unroll the rollable display and the plurality of thin plates, and a coil spring connected between the fixing shaft and the rotation roll. The coil spring may generate an elastic restoring force to the rotation roll in a rotation direction in which the rollable display and the plurality of thin plates are rolled.

A first end part of the rollable display and a first end part of each of the plurality of thin plates may be fixed to the roller. The rollable display device may further include a supporting unit that supports a second end part of the rollable display and a second end part of each of the plurality of thin plates, the supporting unit extending in the second direction.

The supporting unit may include an upper beam that supports the second end part of the rollable display and a lower beam that faces the upper beam and supports the second end part of each of the plurality of thin plates. The second end part of each of the plurality of thin plates is positioned between the upper beam and the lower beam.

The supporting unit may further include an elastic connection part that connects the upper beam and the lower beam and generates an elastic restoring force to at least one of the upper beam and the lower beam in a direction in which the upper beam and the lower beam are spaced from each other, and a locker that selectively fixes an interval between the upper beam and the lower beam.

The upper beam may include a plurality of first protrusions that protrude into a center part of the plurality of thin plates in the second direction.

The lower beam may include a plurality of second protrusions that protrude onto an outer part of the plurality of thin plates in the second direction.

BRIEF DESCRIPTION OF THE DRAWINGS

Features will become apparent to those of skill in the art by describing in detail exemplary embodiments with reference to the attached drawings in which:

FIG. 7 illustrates a cross-sectional view taken along a line VII-VII of FIG. 5.

DETAILED DESCRIPTION

Figure 1:
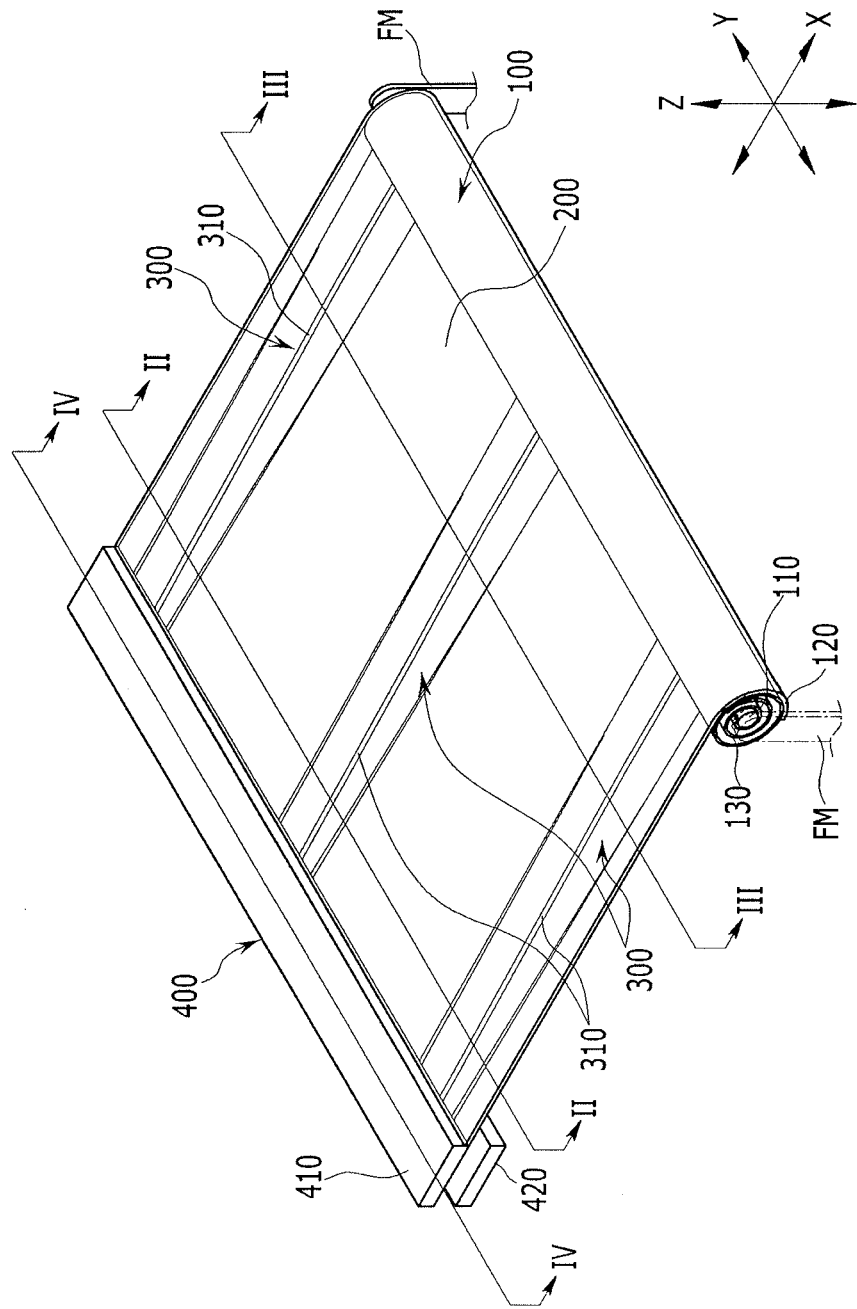
FIG. 1 illustrates a perspective view showing a rollable display device according to an exemplary embodiment as a perspective view showing a state in which the rollable display is unrolled from a roller.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of features may be exaggerated for clarity of illustration. Like reference numerals refer to like elements throughout.

FIG. 1 illustrates a perspective view showing a rollable display device according to an exemplary embodiment showing a state in which the rollable display is unrolled from a roller.

As shown in FIG. 1, the rollable display device may include a roller 100, a rollable display 200, a plurality of thin plates 300, and a supporting unit 400. The rollable display 200 of the rollable display device may be rolled onto a roller 100 along a first direction X or may be unrolled from the roller 100 along the first direction X.

Herein, the term "thin plates" may be understood in the context of the rollable display device as described herein. For example, the thin plates may have a suitable thickness and be made of a suitable material for being rollable onto the roller 100, for being bendable to support the rollable display 200 and resist re-rolling when unrolled and pressed by the supporting unit 400, etc.

The roller 100 may extend in a second direction Y crossing the first direction X. The roller 100 may be rotated in a clockwise direction, and the rollable display 200 may be rolled onto the roller 100 in the first direction X. The roller 100 may be rotated in a counterclockwise direction, and the rollable display 200 may be unrolled from the roller 100 in the first direction X. In some implementations, the roller 100 may be rotated in the counterclockwise direction or the clockwise direction, and the rollable display 200 may be rolled onto the roller 100 in the first direction X or the rollable display 200 may be unrolled from the roller 100 in the first direction X.

The roller 100 may include a fixing shaft 110, a rotation roll 120, and a coil spring 130.

The fixing shaft 110 may extend in the second direction Y. Both end parts of the fixing shaft 110 may be fixed to a fixing part FM. The fixing shaft 110 may be positioned inside the rotation roll 120.

The rotation roll 120 may extend in the second direction Y and may be rotated based on the fixing shaft 110. A ball bearing may be positioned between the rotation roll 120 and the fixing shaft 110. One end part of the rollable display 200 and one end part of each of the plurality of thin plates 300 may be fixed to the rotation roll 120. As the rotation roll 120 is rotated based on the fixing shaft 110, the rollable display 200 and the plurality of thin plates 300 may be rolled onto the rotation roll 120 in the first direction X. As the rotation roll 120 is rotated based on the fixing shaft 110, the rollable display 200 and the plurality of thin plates 300 may be unrolled from the rotation roll 120 in the first direction X.

The coil spring 130 may be connected between the fixing shaft 110 and the rotation roll 120. The coil spring 130 may connect the end part of the fixing shaft 110 and the end part of the rotation roll 120. In some implementations, the coil spring 130 may connect the part of the fixing shaft 110 and the part of the rotation roll 120. The coil spring 130 may generate an elastic restoring force to the rotation roll 120 in the direction (for example, the clockwise direction) that the rollable display 200 and the plurality of thin plates 300 are rolled.

For example, when the rotation roll 120 is rotated in the counterclockwise direction based on the fixing shaft 110 such that the rollable display 200 and the plurality of thin plates 300 are unrolled from the rotation roll 120, as the rotation roll 120 is rotated in the counterclockwise direction, the coil spring 130 may be rolled in the counterclockwise direction based on the fixing shaft 110. Accordingly, the coil spring 130 may generate the elastic restoring force to the rotation roll 120 in the clockwise direction as the direction that the rollable display 200 and the plurality of thin plates 300 are rolled.

The rollable display 200 may display the image. The rollable display 200 may be rolled onto the roller 100 in the first direction X, or may be unrolled from the roller 100 in the first direction X. The rollable display 200 may include a flexible substrate or film that displays an image via at least one among a liquid crystal display, an organic light emitting diode display, an electronic ink display, or the like. The rollable display 200 may be a transparent type or a light transmissive type display that is visible through the rollable display 200. At a front surface of the rollable display 200, a touch sensor having a form such as a touch film, a touch sheet, a touch pad, or the like and sensing a touch operation may be positioned. One end part of the rollable display 200 in the first direction X may be fixed to the roller 100, and the other end part of the rollable display 200 in the first direction X may be supported to the supporting unit 400. For example, one end part and another end part, as two end parts of the rollable display 200 extending in the second direction Y, may be respectively supported by the roller 100 and the supporting unit 400.

The plurality of thin plates 300 may be positioned at a rear surface of the rollable display 200, and may be rolled onto the roller 100 along with the rollable display 200 in the first direction X. The plurality of thin plates 300 may be unrolled from the roller 100 along with the rollable display 200 in the first direction X. The plurality of thin plates 300 may respectively extend in the first direction X. The plurality of thin plates 300 may be respectively separated from each other in the second direction Y. The plurality of thin plates 300 may respectively include one plate or a plurality of deposited plates.

Figure 2:
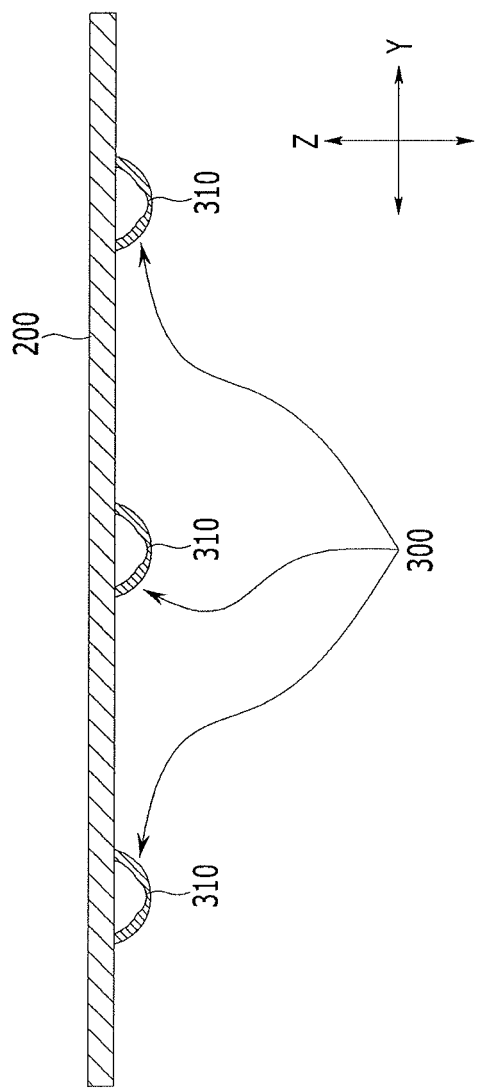
FIG. 2 illustrates a cross-sectional view taken along a line II-II of FIG. 1.
Figure 3:
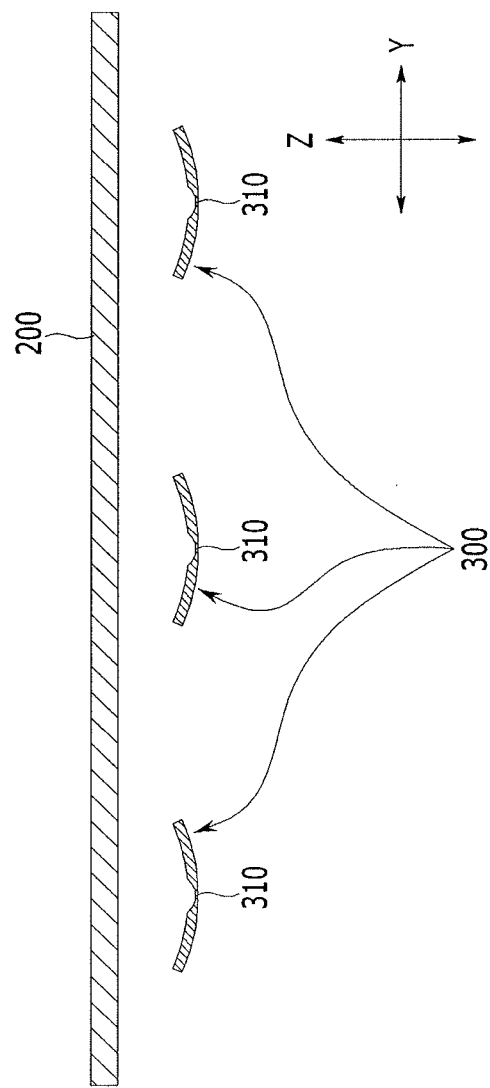
FIG. 3 illustrates a cross-sectional view taken along a line of FIG. 1.

FIG. 2 illustrates a cross-sectional view taken along a line II-II of FIG. 1. FIG. 3 illustrates a cross-sectional view taken along a line of FIG. 1. FIG. 2 and FIG. 3 show a plurality of thin plates 300 and the rollable display 200 for convenience of description.

As shown in FIG. 1 to FIG. 3, the plurality of thin plates 300 respectively include a groove 310 that is recessed and that extends in the first direction X. The grooves 310 faces the rollable display 200. When the plurality of thin plates 300 are unrolled from the roller 100 in the first direction X, the plurality of thin plates 300 may be curved in the second direction Y at the rear surface of the rollable display 200. At least part of edges of the plurality of thin plates 300 may support the rear surface of the rollable display 200 in the second direction Y. At least part of the edges of the plurality of thin plates 300 may be in contact with the rear surface of the rollable display 200 in the second direction Y.

The plurality of thin plates 300 may be bent with a curvature that becomes larger in the second direction Y with respect to a distance away from the roller 100 in the first direction X. FIG. 2 illustrates a part of the plurality of thin plates 300 that is positioned farther away from the roller 100 in the first direction X compared with the other part of the plurality of thin plates 300 shown in FIG. 3. The part of the plurality of thin plates 300 shown in FIG. 2 are bent with a larger curvature in the second direction Y compared with the other part of the plurality of thin plates 300 shown in FIG. 3. The edges of the part of the plurality of thin plates 300 shown in FIG. 2 in the second direction Y are in contact with the rear surface of the rollable display 200, thereby supporting the rollable display 200. The edges of the other part of the plurality of thin plates 300 shown in FIG. 3 in the second direction Y are spaced apart from the rear surface of the rollable display 200.

First end parts of the plurality of thin plates 300 may be fixed to the roller 100, and second end parts of the plurality of thin plates 300 may be supported by the supporting unit 400. First end parts of the plurality of thin plates 300 fixed to the roller 100 may be fixed to the roller 100 in a flat state in the second direction Y. In some implementations, first end parts of the plurality of thin plates 300 fixed to the roller 100 may be fixed to the roller 100 in the bent state with the curvature in the second direction Y. The second end parts of the plurality of thin plates 300 supported by the supporting unit 400 maybe in the flat state in the second direction Y or may be in the bent state with the curvature in the second direction Y. For example, for the second end parts of the plurality of thin plates 300 supported by the supporting unit 400, only a center part in the second direction Y may be supported by the supporting unit 400. The center part of the second end parts of the plurality of thin plates 300 supported by the supporting unit 400 may be supported by the supporting unit 400 to be movable in a third direction Z respectively crossing the first direction X and the second direction Y.

Figure 4:
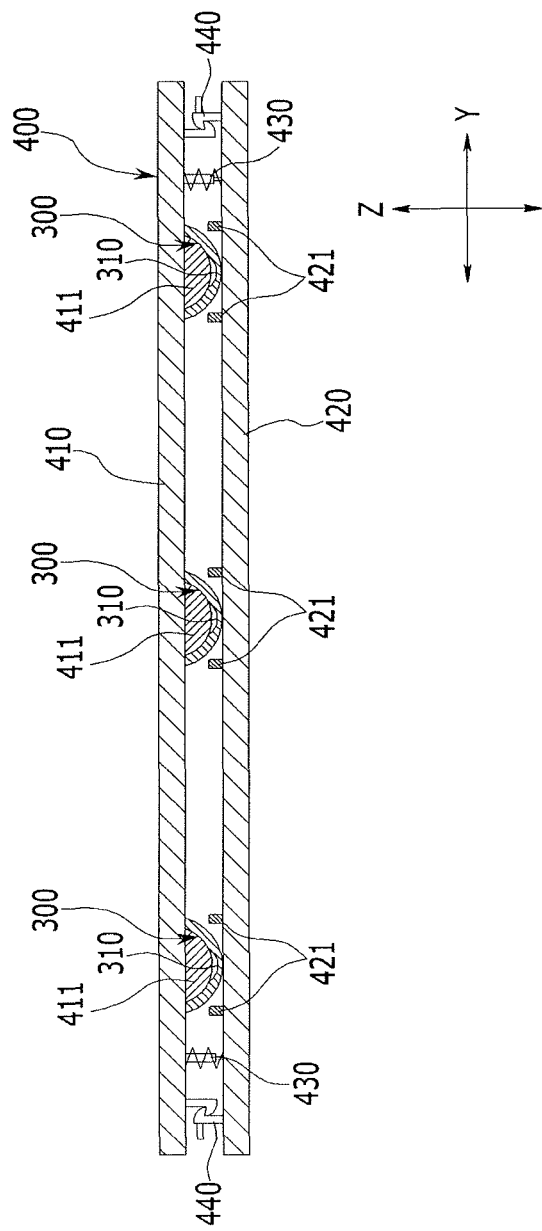
FIG. 4 illustrates a cross-sectional view taken along a line IV-IV of FIG. 1.

FIG. 4 illustrates a cross-sectional view taken along a line IV-IV of FIG. 1.

As shown in FIG. 1 and FIG. 4, the supporting unit 400 may extend in the second direction Y and may support the second end part of the rollable display 200 and the second end parts of the plurality of thin plates 300.

The supporting unit 400 may include an upper beam 410, a lower beam 420, an elastic connection part 430, and a locker 440.

The upper beam 410 may extend in the second direction Y and may support the second end part of the rollable display 200. The upper beam 410 may include a plurality of first protrusions 411 that protrude in the third direction Z into the center part in the second direction Y of the plurality of thin plates 300. The plurality of first protrusions 411 may be respectively spaced apart from each other in the second direction Y such that each first protrusion 411 corresponds to one of the plurality of thin plates 300. The plurality of first protrusions 411 that respectively protrude to the plurality of thin plates 300 may have various shapes such as a polygonal shape such as a triangular, quadrangular, pentagonal, or hexagonal shape, or an elliptical or a circular shape. For example, the plurality of first protrusions 411 may each have a semi-circular shape.

The lower beam 420 may extend in the second direction Y and may face the upper beam 410. The lower beam 420 may support the second end parts of the plurality of thin plates 300. The lower beam 420 may include a plurality of second protrusions 421 that are spaced apart in the second direction Y and that protrude in the third direction Z toward the outer part in the second direction Y of the plurality of thin plates 300. The plurality of second protrusions 421 may protrude in the third direction Z at locations corresponding to second end parts of the plurality of thin plates 300 in the second direction Y. The plurality of second protrusions 421 that respectively protrude toward the plurality of thin plates 300 may have various shapes such as a polygon shape, such as a triangular, a quadrangular, a pentagonal, or hexagonal shape, or an elliptical or circular shape. For example, the plurality of second protrusions 421 respectively have a quadrangular shape The second end parts of the plurality of thin plates 300 may be positioned between the lower beam 420 and the upper beam 410.

The elastic connection part 430 may connect the upper beam 410 and the lower beam 420. The elastic connection part 430 may generate an elastic restoring force to at least one of the upper beam 410 and the lower beam 420 in a direction that increases a separation between the upper beam 410 and the lower beam 420. The elastic connection part 430 may include a plurality of connection parts that are respectively connected to the upper beam 410 and the lower beam 420 to be mutually connected, and a spring enclosing the connection parts.

For example, when the interval between the upper beam 410 and the lower beam 420 becomes narrow, the spring of the elastic connection part 430 connecting the upper beam 410 and the lower beam 420 may be compressed by the upper beam 410 and the lower beam 420. The elastic connection part 430 may generate the elastic restoring force to at least one of the upper beam 410 and the lower beam 420 in the direction away from the upper beam 410 and the lower beam 420.

The elastic connection part 430 that connects the upper beam 410 and the lower beam 420 and simultaneously generates the elastic restoring force to at least one of the upper beam 410 and the lower beam 420 in the direction away from between the upper beam 410 and the lower beam 420 may be formed of a suitable structure. In some implementations, the elastic connection part 430 may include a shock absorber.

The locker 440 may be adjacent to the elastic connection part 430 and may be positioned between the upper beam 410 and the lower beam 420. The locker 440 may selectively fix the interval between the upper beam 410 and the lower beam 420. The locker 440 may include a plurality of fixing parts that are respectively connected to the upper beam 410 and the lower beam 420 to be mutually fixed in the structure.

For example, when the interval between the upper beam 410 and the lower beam 420 is narrowed to a predetermined distance, the locker 440 may be locked and may fix the interval between the upper beam 410 and the lower beam 420. As another example, if the locker 440 is unlocked after being locked, the interval between the upper beam 410 and the lower beam 420 may become greater due to the elastic restoring force generated in the elastic connection part 430.

Next, a state in which the rollable display 200 is rolled onto the roller 100 and a state in which the rollable display 200 is unrolled from the roller 100 will be described with reference to FIG. 1 to FIG. 7.

First, the state in which the rollable display 200 is rolled onto the roller 100 will be described with reference to FIG. 5 to FIG. 7.

Figure 5:
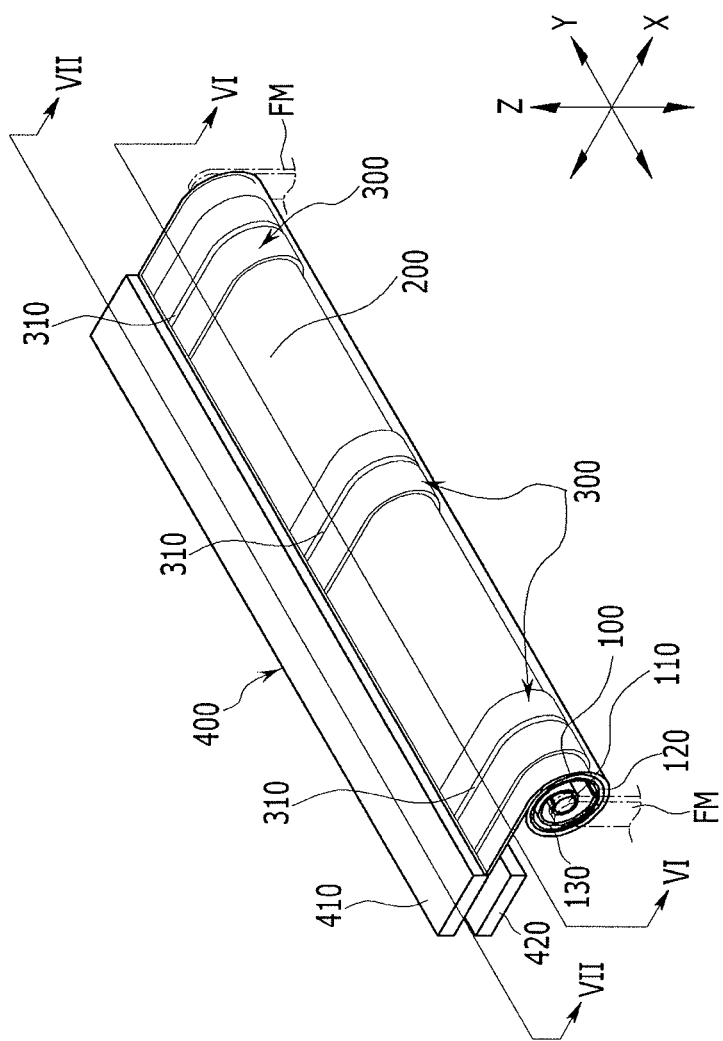
FIG. 5 illustrates a perspective view showing a state in which a rollable display is rolled to a roller shown in FIG. 1.

FIG. 5 illustrates a perspective view showing a state in which a rollable display is rolled onto a roller shown in FIG. 1. FIG. 6 illustrates a cross-sectional view taken along a line VI-VI of FIG. 5. FIG. 7 illustrates a cross-sectional view taken along a line VII-VII of FIG. 5.

Figure 6:
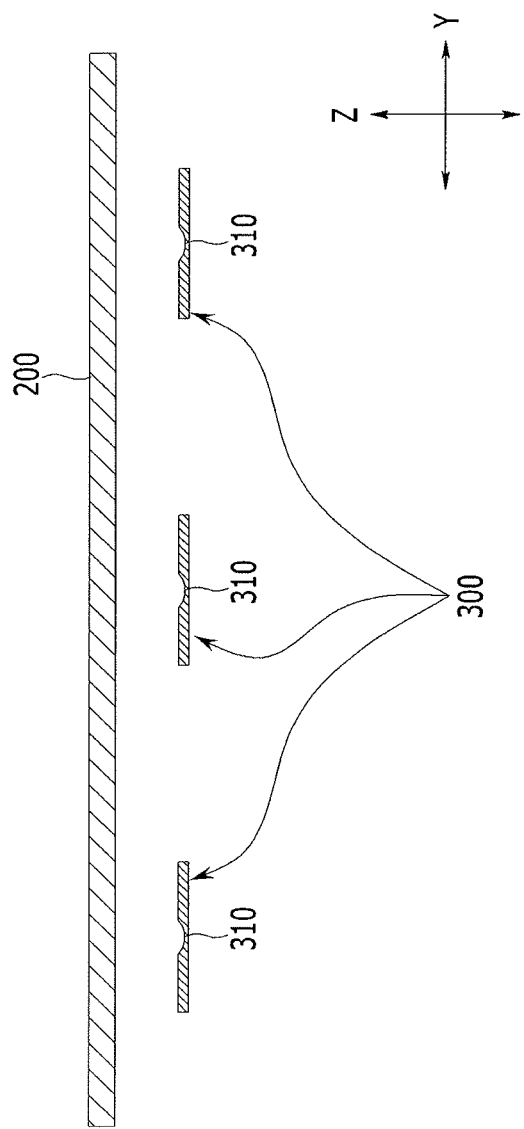
FIG. 6 illustrates a cross-sectional view taken along a line VI-VI of FIG. 5.

As shown in FIG. 5 to FIG. 7, the rollable display 200 and the plurality of thin plates 300 may be rolled together onto the roller 100. The locker 440 of the supporting unit 400 may be unlocked, and the interval between the upper beam 410 and the lower beam 420 may be formed by the elastic connection part 430. The plurality of thin plates 300 in the state in which they are supported by the lower beam 420 may maintain the flat state in the second direction Y between the upper beam 410 and the lower beam 420 and may be separated from the first protrusions 411 of the upper beam 410. The plurality of thin plates 300 rolled onto the roller 100 may maintain the flat state in the second direction Y. The parts of the plurality of thin plates 300 positioned between the roller 100 and the supporting unit 400 may be spaced apart from the rollable display 200 and may maintain the flat state in the second direction Y.

From the above-described state, the state in which the rollable display 200 is unrolled from the roller 100 will be described with reference to FIG. 1 to FIG. 4.

As shown in FIG. 1 to FIG. 4, when the supporting unit 400 is pulled from the state described with reference to FIG. 5 to FIG. 7 in the direction away from the roller 100, while the supporting unit 400 is away from the roller 100 in the first direction X, the rotation roll 120 of the roller 100 may be rotated in the counterclockwise direction based on the fixing shaft 110 such that the rollable display 200 and the plurality of thin plates 300 are unrolled from the rotation roll 120 in the first direction X.

In this case, the coil spring 130 may generate the elastic restoring force to the rotation roll 120 in the clockwise direction as the direction that the rollable display 200 and the plurality of thin plates 300 are rolled.

Next, the upper beam 410 and the lower beam 420 may be pressed such that the interval between the upper beam 410 and the lower beam 420 of the supporting unit 400 narrows to the predetermined distance. The plurality of first protrusions 411 of the upper beam 410 may press and be in contact with the center portion in the second direction Y of the plurality of thin plates 300, and the plurality of second protrusions 421 of the lower beam 420 press both end parts in the second direction Y of the plurality of thin plates 300. The plurality of thin plates 300 positioned between the upper beam 410 and the lower beam 420 of the supporting unit 400 may be bent to have the curvature in the second direction Y at the rear surface of the rollable display 200.

The plurality of thin plates 300 include the groove 310. Accordingly, the plurality of thin plates 300 may be easily bent while having the curvature in the second direction Y. The edges of the plurality of bent thin plates 300 in the second direction Y may be in contact with the rear surface of the rollable display 200 and support the rollable display 200.

As above-described, when the plurality of bent thin plates 300 have the curvature in the second direction Y, the edges of the plurality of bent thin plates 300 in the second direction Y may be in contact with the rear surface of the rollable display 200 and may support the rollable display 200.

For example, when the rollable display 200 and the plurality of thin plates 300 are unrolled in the first direction X from the roller 100, and the plurality of thin plates 300 are bent with the curvature in the second direction Y, bending of the rollable display 200 and the plurality of thin plates 300 in the third direction Z may be suppressed, and the rollable display 200 that is unrolled from the roller 100 is maintained with the flat state.

If the interval between the upper beam 410 and the lower beam 420 is narrowed to the predetermined distance, the locker 440 may be locked such that the interval between the upper beam 410 and the lower beam 420 is fixed and the plurality of thin plates 300 are fixed by the first protrusions 411 of the upper beam 410 to be in the bent state with the curvature in the second direction Y.

In this case, the elastic connection part 430 may generate the elastic restoring force at at least one of the upper beam 410 and the lower beam 420 in the direction in which the upper beam 410 and the lower beam 420 are separated from each other.

As above-described, the plurality of thin plates 300 may be bent with the curvature in the second direction Y in the unrolled state in the first direction X, The plurality of thin plates 300 may be suppressed from being bent n the first direction X. although the coil spring 130 generates the elastic restoring force to the rotation roll 120 in the clockwise direction as the direction that the rollable display 200 and the plurality of thin plates 300 are rolled, the rotation roll 120 may be prevented from rotating in the clockwise direction. Accordingly, the rollable display 200 and the plurality of thin plates 300 may be suppressed from being rolled onto the roller 100.

For example, when the plurality of thin plates 300 are bent with the curvature in the second direction Y, the rollable display 200 and the plurality of thin plates 300 may be suppressed from being rolled onto the roller 100. The state in which the rollable display 200 is unrolled from the roller 100 may be maintained.

As above-described, with just the operations of pulling the supporting unit 400 from the roller 100 and pressing the upper beam 410 and the lower beam 420 of the supporting unit 400, the rollable display 200 may be easily unrolled from the roller 100 and may be simultaneously maintained in the flatly unrolled state.

When the rollable display 200 is again re-rolled onto the roller 100 from the state in which the rollable display 200 is unrolled from the roller 100, when the locker 440 is unlocked, the upper beam 410 and the lower beam 420 of the supporting unit 400 are separated from each other by the elastic restoring force of the elastic connection part 430, and the first protrusions 411 of the upper beam 410 are separated from the plurality of thin plates 300 such that the plurality of thin plates 300 are transformed into the flat state from the bent state in the second direction Y. When the plurality of thin plates 300 are transformed into the flat state in the second direction Y, the plurality of thin plates 300 may be easily bent in the first direction X and simultaneously, the rotation roll 120 may be rotated in the clockwise direction by the elastic restoring force of the coil spring 130 such that the rollable display 200 and the plurality of thin plates 300 may be easily rolled onto the roller 100 in the first direction X.

For example, with just one operation of unlocking the locker 440, the rollable display 200 is easily rolled onto the roller 100.

As described above, a rollable display device in which the rollable display 200 is easily rolled onto the roller 100 and the rollable display 200 is easily unrolled from the roller 100 is provided.

Also, when unrolling the rollable display 200 from the roller 100, the rollable display device in which the rollable display 200 maintains a flat unrolled state is provided.

By way of summation and review, embodiments provide a rollable display device in which the rollable display is easily rolled onto the roller or is easily unrolled from the roller.

Embodiments also provide a rollable display device maintaining a state in which the rollable display is unrolled to be flat when unrolling the rollable display from the roller.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:
1. A rollable display device, comprising:
a roller;
a rollable display that is rollable onto the roller in a first direction;
a plurality of thin plates positioned at a rear surface of the rollable display, the thin plates being rollable onto the roller in the first direction along with the rollable display; and
a supporting unit supporting the rollable display and the plurality of thin plates,
wherein the supporting unit includes an upper beam and a lower beam that faces the upper beam, and the upper beam includes a plurality of first protrusions that protrude into a center part of the plurality of thin plates in a second direction crossing the first direction, and each of the plurality of first protrusions has a semicircular shape in a cross-section view.

2. The rollable display device as claimed in claim 1, wherein:
the plurality of thin plates are spaced apart from each other in the second direction.

3. The rollable display device as claimed in claim 2, wherein:
the rollable display and the plurality of thin plates are unrollable from the roller in the first direction, and
the plurality of thin plates in a state of being unrolled from the roller are bent with a curvature in the second direction at the rear surface of the rollable display.

4. The rollable display device as claimed in claim 3, wherein:
in the state of the rollable display and the plurality of thin plates being unrolled from the roller, edges of the plurality of thin plates in the second direction support the rear surface of the rollable display.

5. The rollable display device as claimed in claim 3, wherein:
in the state of the rollable display and the plurality of thin plates being unrolled from the roller, the curvature of the plurality of thin plates in the second direction increases relative to a distance from the roller in the first direction.

6. The rollable display device as claimed in claim 3, wherein:
the plurality of thin plates include a groove that is recessed and extends in the first direction, and
the groove faces the rollable display.

7. The rollable display device as claimed in claim 2, wherein:
the plurality of thin plates in a state of being rolled onto the roller are flat in the second direction.

8. The rollable display device as claimed in claim 2, wherein the roller includes:
a fixing shaft extending in the second direction;
a rotation roll extending in the second direction, the rotation roll being rotatable with respect to the fixing shaft to roll and unroll the rollable display and the plurality of thin plates; and
a coil spring connected between the fixing shaft and the rotation roll, and
wherein the coil spring generates an elastic restoring force to the rotation roll in a rotation direction in which the rollable display and the plurality of thin plates are rolled.

9. The rollable display device as claimed in claim 2, wherein:
a first end part of the rollable display and a first end part of each of the plurality of thin plates are fixed to the roller, and
the supporting unit supports a second end part of the rollable display and a second end part of each of the plurality of thin plates, the supporting unit extending in the second direction.

10. The rollable display device as claimed in claim 9, wherein
the upper beam supports the second end part of the rollable display,
the lower beam supports the second end part of each of the plurality of thin plates, and
the second end part of each of the plurality of thin plates is positioned between the upper beam and the lower beam.

11. The rollable display device as claimed in claim 10, wherein the supporting unit further includes:
an elastic connection part that connects the upper beam and the lower beam and generates an elastic restoring force to at least one of the upper beam and the lower beam in a direction in which the upper beam and the lower beam are spaced from each other; and
a locker that selectively fixes an interval between the upper beam and the lower beam.

12. The rollable display device as claimed in claim 10, wherein:
the lower beam includes a plurality of second protrusions that protrude onto an outer part of the plurality of thin plates in the second direction.

13. A rollable display device, comprising:
a roller;
a rollable display that is rollable onto the roller in a first direction;
a plurality of thin plates positioned at a rear surface of the rollable display, the thin plates being rollable onto the roller in the first direction along with the rollable display; and
a supporting unit supporting the rollable display and the plurality of thin plates,
wherein:
the supporting unit includes an upper beam and a lower beam that faces the upper beam, the upper and lower beams extending in a second direction, the second direction crossing the first direction,
the upper beam includes a plurality of first protrusions that protrude into a center part of the plurality of thin plates in a third direction, the third direction crossing the first direction and the second direction,
the plurality of thin plates are spaced apart from each other in the second direction,
a first end part of the rollable display and a first end part of each of the plurality of thin plates are fixed to the roller, and
the supporting unit supports a second end part of the rollable display and a second end part of each of the plurality of thin plates, the supporting unit extending in the second direction.

14. A rollable display device configured to extend and retract a rollable display in a first direction, the rollable display device comprising:
an upper beam extending in a second direction orthogonal to the first direction, the upper beam being attached to a first end of the rollable display;
a lower beam extending in the second direction and attached to the first end of the rollable display, the lower beam being positioned at a lower surface of the rollable display, the first end of the rollable display being fixed between the upper beam and the lower beam,
a roller, the roller being attached to a second end of the rollable display and rotating about an axis that extends in the second direction, the first end of the rollable display being extendable from the roller;
a plurality of thin plates positioned at the lower surface of the rollable display, each of the thin plates extending in the first direction when the rollable display is extended, the thin plates being spaced apart from each other in the second direction; and
wherein:
first ends of each of the thin plates are fixed between the upper beam and the lower beam, the first ends of each of the thin plates having a curvature such that an apex of the curvature is pointed toward the lower beam and edges of the thin plates are disposed adjacent to the upper beam, and the upper beam includes a plurality of protrusions interposed between the upper beam and the lower beam, the protrusions each protruding toward the lower beam, each of the thin plates having a corresponding one of the protrusions located in the curvature of the first end of the thin plate, and each of the plurality of protrusions has a semi-circular shape in a cross-section view.

* * * * *